(12) United States Patent
Farmer et al.

(10) Patent No.: US 6,459,579 B1
(45) Date of Patent: Oct. 1, 2002

(54) APPARATUS AND METHOD FOR DIRECTING AIRFLOW IN THREE DIMENSIONS TO COOL SYSTEM COMPONENTS

(75) Inventors: Daniel Fairchild Farmer, Mountain View, CA (US); Ashok Krishnamurthi, San Jose, CA (US); Richard Singer, Menlo Park, CA (US); Ali Mira, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 31 days.

(21) Appl. No.: 09/752,824

(22) Filed: Jan. 3, 2001

(51) Int. Cl.⁷ .................................................. H05K 7/20
(52) U.S. Cl. ..................... 361/695; 361/687; 361/690; 361/692; 312/223.1; 165/104.33
(58) Field of Search ................................ 361/687, 689, 361/690, 692, 694, 695, 698, 736, 787, 696, 796, 756; 165/803, 806, 104.33, 104.36, 122, 124, 126, 47, 137; 312/222.1, 223.2, 265.3, 236; 454/184; 174/16.1, 48; 364/708.1; 211/41.17

(56) References Cited

U.S. PATENT DOCUMENTS

| 4,158,875 | A | * | 6/1979 | Tajima et al. ............... 361/384 |
| 4,797,783 | A | * | 1/1989 | Kohmoto ..................... 361/384 |
| 4,901,138 | A | * | 2/1990 | Kushibiki et al. ............. 357/81 |
| 5,107,398 | A | * | 4/1992 | Bailey ........................ 364/384 |
| 5,544,012 | A | * | 8/1996 | Koike .......................... 361/695 |
| 5,796,580 | A | * | 8/1998 | Komatsu et al. ............. 361/687 |
| 6,128,187 | A | * | 10/2000 | Mimlitch et al. ........... 361/690 |
| 6,151,210 | A | * | 11/2000 | Cerioglu et al. ............. 361/690 |
| 6,270,313 | B1 | * | 8/2001 | Chuang et al. .............. 415/148 |

FOREIGN PATENT DOCUMENTS

| JP | 07131173 A | * | 10/1983 | ............ H05K/7/14 |
| JP | 02000101272 A | * | 4/2000 | ............ H05K/7/20 |
| RU | 1476628 A | * | 7/1987 | ............ H05K/7/20 |

* cited by examiner

Primary Examiner—Darren Schuberg
Assistant Examiner—Michael Datskovsky
(74) Attorney, Agent, or Firm—Harrity & Snyder, L.L.P.

(57) ABSTRACT

The invention provides forced-air cooling to components mounted on circuit boards oriented in a side-to-side direction in a system. Airflow may enter and exit the system through the front and back (or vice-versa), rather than the sides of the system. In one embodiment, airflow entering the front of the system is re-directed in an upward direction, then split to form airflow branches traversing in a side-to-side direction. The airflow branches traverse across the surfaces of circuit boards, then are directed in an upward direction and out the back (or front) of the system. The airflow branches preferably move substantially the same volume of air per unit of time.

18 Claims, 4 Drawing Sheets

APPARATUS AND METHOD FOR DIRECTING AIRFLOW IN THREE DIMENSIONS TO COOL SYSTEM COMPONENTS

BACKGROUND OF THE INVENTION

A. Field of the Invention

The present invention relates generally to system cooling and, more particularly, to directing airflow in three dimensions to cool components of a system, especially electronic components mounted on circuit boards in a system.

B. Description of Related Art

Conventional electronic systems, such as a large-scale computers and networking devices, often contain circuit boards on which electronic components are mounted. During operation, the electronic components in these systems dissipate heat, causing the internal system temperature to rise. The amount of temperature rise depends on various factors, such as the number, types, and complexity of the components. To avoid reaching internal temperatures that may adversely affect system operation or performance, many systems are equipped with cooling mechanisms.

One type of cooling mechanism involves forcing air through a system to cool its components. For example, fans may be positioned to draw outside air into the system through an air inlet, blow the air along the surface of circuit boards, and expel the heated air out of the system. The positioning of these fans is influenced by the arrangement and/or alignment of (1) the components on the boards and (2) the boards in the system.

This type of cooling mechanism, however, suffers several drawbacks. First, the effectiveness of the cooling mechanism may be affected by the location of the air inlet. In some cases, the air around the air inlet may be heated. This may happen, for example, where the air inlet of one system is located close to the air outlet of another system. It is common (especially with networking devices and large computer systems) for two or more systems with cooling mechanisms to be located side-by-side in close proximity. In these cases, the cooling mechanism draws in heated air expelled from the adjacent system, which prevents effective cooling of the electronic components.

Another drawback with forced-air cooling mechanisms is that the amount of cooling may vary in different areas of a system. Areas exposed to higher airflow velocity typically cool faster than areas exposed to lower airflow velocity. This may be problematic in areas in which the airflow velocity is too low to provide sufficient cooling to the affected components. Airflow velocity changes and variations are apt to occur in complex systems, in which the airflow direction may change one or more times and/or in which a single airflow source feeds into multiple airflow branches for cooling respective circuit boards.

Therefore, there is a need for a cooling mechanism for electronic systems that solves the problems and overcomes the drawbacks of prior art cooling mechanisms.

SUMMARY OF THE INVENTION

Systems and methods, consistent with the present invention, address this and other needs by providing forced-air cooling to components mounted on circuit boards oriented in a side-to-side direction in a system. Airflow may enter and exit the system through the front and back (or vice-versa), rather than the sides of the system. In one embodiment, airflow entering the front of the system is re-directed in an upward direction, then split to form airflow branches traversing in a side-to-side direction. The airflow branches traverse across the surfaces of circuit boards, then are directed in an upward direction and out the back (or front) of the system. The airflow branches preferably move substantially the same volume of air per unit of time.

In accordance with the purpose of the invention as embodied and broadly described herein, a cooling mechanism comprises an air inlet for drawing airflow in a front-to-back direction, an exhaust module for drawing airflow from the air-intake module to an upward direction; at least one air guide for redirecting airflow from the first module to a plurality of airflow branches in a side-to-side direction; a vertical pathway for combining the plurality of airflow branches to form an airflow in the upward direction; and a second exhaust module for redirecting airflow, to the front-to-back direction, from the vertical pathway and expelling the airflow out of the system.

Other implementations and concepts consistent with the invention are described. The invention is defined by the claims.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

Systems and methods, consistent with the present invention, provide forced air to cool components contained in the system. According to the invention, airflow may enter and exit the system through the front and back (or vice-versa), rather than the sides of the system. In one embodiment, airflow entering the front of the system is re-directed in an upward direction, then split to form airflow branches traversing in a side-to-side direction. The airflow branches traverse across the surfaces of circuit boards, then are directed in an upward direction and out the back (or front) of the system. The airflow branches preferably move substantially the same volume of air per unit of time. Other aspects of the invention are described herein.

The following detailed description of the invention refers to the accompanying drawings. The same reference numbers in different drawings identify the same or similar elements. Also, the following detailed description does not limit the invention. Instead, the scope of the invention is defined by the appended claims and equivalents.

EXEMPLARY APPARATUS

Figure 1:
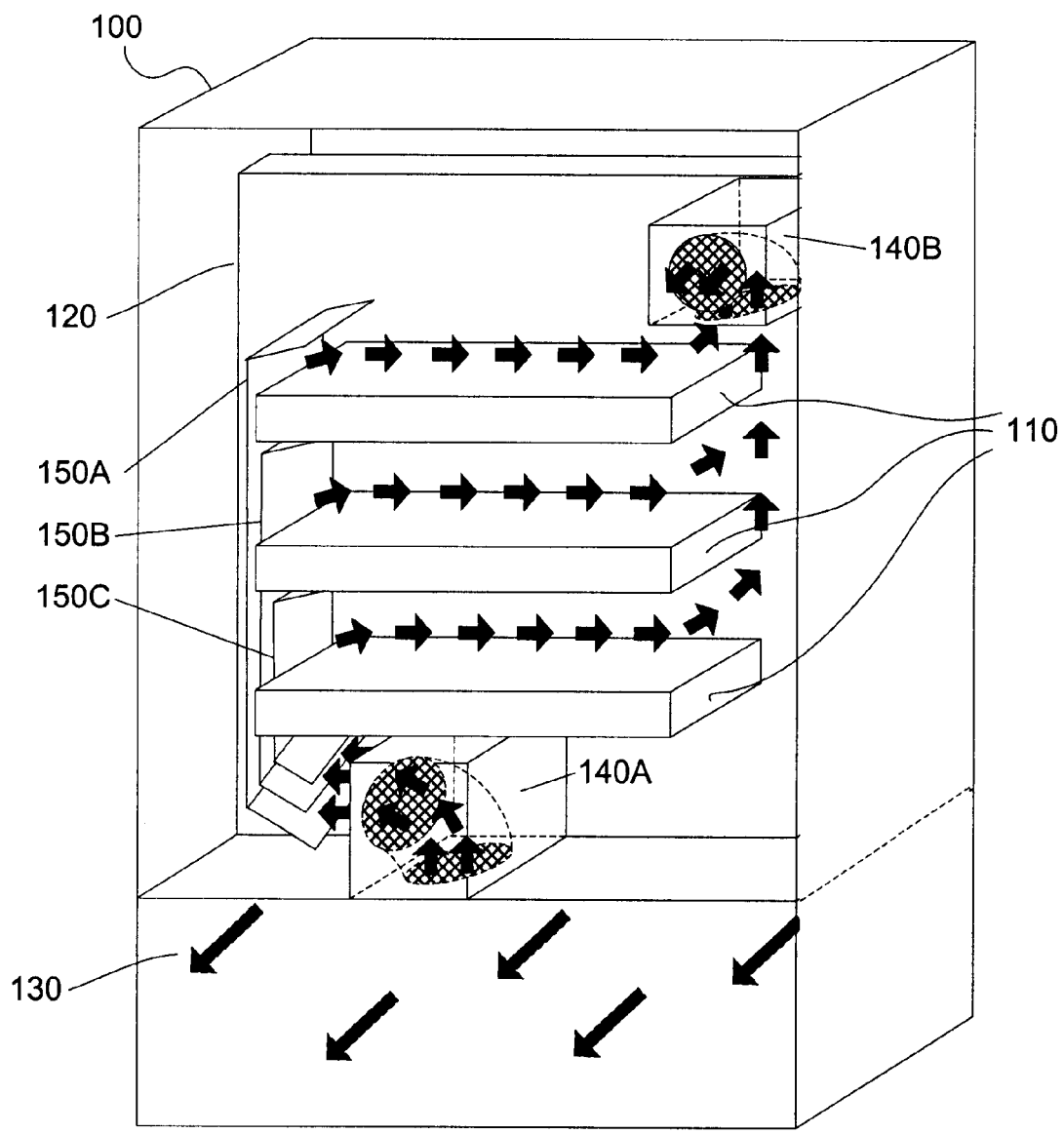
FIG. 1 shows a perspective view of an exemplary system in which the invention may be used, including airflow through the system.

FIG. 1 shows a perspective view of an exemplary system 100 in which the invention may be used. As shown in FIG. 1, system 100 includes a plurality of circuit boards 110, a midplane 120, an air passage 130, exhaust modules 140A–140B, and air guides 150A–150C. Airflows are represented by arrows. System 100 is oriented in FIG. 1 such that the front faces into the page, the back faces out of the page, the sides face the left and right, the top faces up, and the bottom faces down. The perspective view shown in FIG. 1 shows the inside of system 100 from the back.

Circuit boards 110 connect into midplane 120 and are preferably oriented in a side-to-side direction (e.g., the surfaces on which electrical components are mounted are not parallel to the sides of system 100, but may be parallel to the top, bottom, front, or back). Circuit boards 110 are preferably arranged in parallel with one another and separated a sufficient distance so that air may flow between them. While midplane 120 is shown as supporting circuit boards 110, in alternative embodiments, the system may contain circuit boards without a midplane.

Air passage 130 provides an air inlet (not shown in FIG. 1) for outside air to enter system 100. Air inlet is preferably located in the front or back of system 100. As shown in FIG. 1, air passage 130 is preferably located at (or near) the bottom of system 100. Air entering system 100 through air passage 130 preferably flows in a direction from the front of system 100 to the back (or vice-versa). In addition to an air inlet, air passage 130 may also contain an air outlet (not shown) through which air may exit system 100.

Figure 3A:
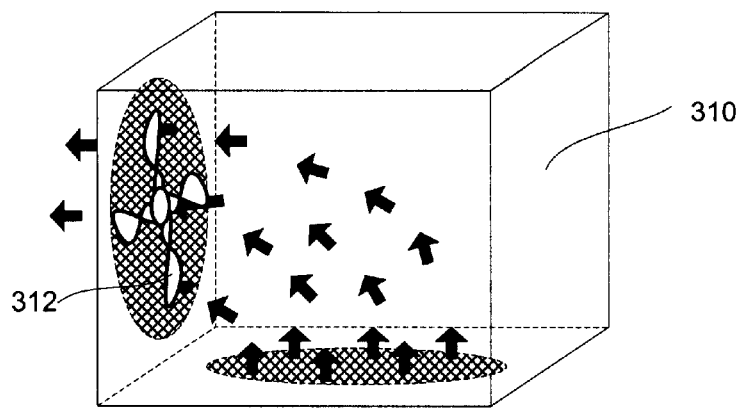
FIGS. 3A–3C show exemplary exhaust modules which may be used in the system shown in FIG. 1.
Figure 3B:
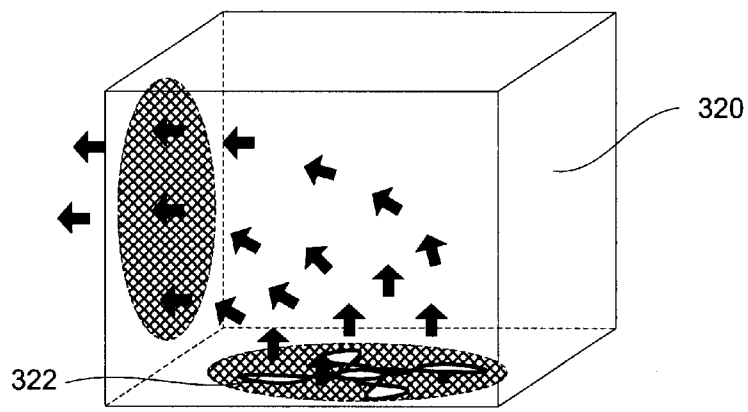
Figure 3C:
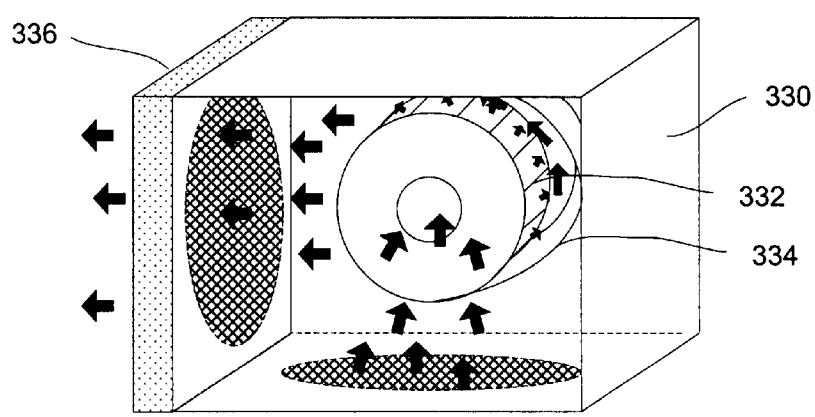

Exhaust module 140A is located above air passage 130 and draws airflow in an upward direction. As shown in FIG. 1, exhaust module 140A draws air in an upward direction, then directs the air toward one side of system 100 to air guides 150A–150C. Embodiments of exhaust module 140A are shown in FIGS. 3A–3C.

Air guides 150A–150C are arranged to receive airflow from exhaust module 140A and form airflow branches corresponding to respective ones of circuit boards 110. Air guides 150A–150C may, for example, comprise open or closed ducts, air passages or plenums, baffle, or bent sheet metal. The airflow branches from air guides 150A–150C are preferably directed in a side-to-side direction across surfaces of circuit boards 110. The airflow branches preferably traverse the entire length of circuit boards 110, but may traverse less than the entire length. While three air guides 150 are shown in FIG. 1, fewer or more air guides may be used.

In a preferred embodiment, air guides 150 have respective openings through which air passes. The openings may be located at either or both ends of air guides 150 (e.g., a fixed or adjustable aperture), the middle of air guides 150, or may comprise the cross-section of, for example, an air duct or the distance between adjacent air guides 150. The size of these openings affect the amount of air (e.g., volume per unit of time) that flows through from exhaust module 140A to form the airflow branches which traverse the surfaces of the circuit boards. For example, the size of an opening may affect how many cubic feet per minute ("CFM") of air flows through the air guide. Because of various other factors that may affect the amount of air flow in the airflow branches (e.g., the severity of the direction change, temperature, drag caused by structural air resistance), the opening sizes may need to vary from one another so that the appropriate volume of air is output per unit of time across each of the circuit boards. In some cases, the circuit boards may have cooling requirements (or may need to operate in accordance with predetermined specifications or tolerances) which dictate a minimum CFM. The opening sizes of the air guides may need to be set to accommodate these requirements/specifications/tolerances. For example, if the circuit boards have the same requirements/specifications/tolerances, then the opening sizes may be set so that substantially the same volume of air flows across the circuit boards per unit of time or that the circuit boards are cooled to substantially the same temperatures. If the requirements/specifications/tolerances differ among circuit boards, then different opening sizes may need to be used.

The need to set the appropriate opening sizes may be better understood with reference to system 100 shown in FIG. 1. As shown in FIG. 1, circuit boards 110 are arranged in parallel, with one stacked above another separated by a distance to permit air flow between the circuit boards. Because heat rises, the higher circuit boards may be exposed to higher temperatures and need more CFM. In addition, an appropriate amount of CFM may need to be provided for each airflow branch to ensure that the end of the circuit boards farthest from air guides 150 are sufficiently cooled. Further, the airflow branch closest to exhaust module 140A involves the most severe air direction change and therefore may receive the least amount of airflow compared to the other airflow branches (principles of fluid dynamics). These factors need to be accounted for in setting the opening sizes. Appropriate sizes for the air guide openings may be determined using an airflow meter.

Exhaust module 140B receives the airflow branches after they have traversed the surfaces of circuit boards 110 and expels air out of system 100. Exhaust module 140B preferably expels air out of the back or front of system 100 through an air outlet, though it may also expel air out of an air outlet located at the top or sides. Exhaust module 140B is also described in greater detailed in connection with FIGS. 3A–3C.

Figure 2A:
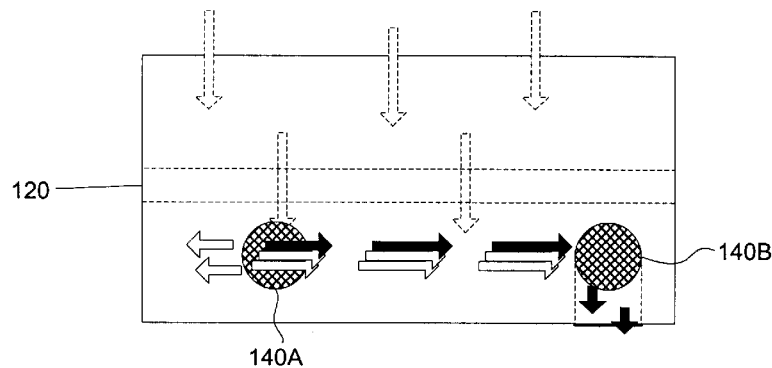
FIGS. 2A–2C show the airflow from the top, back, and side views, respectively, of the system shown in FIG. 1.
Figures 2B, 2C:
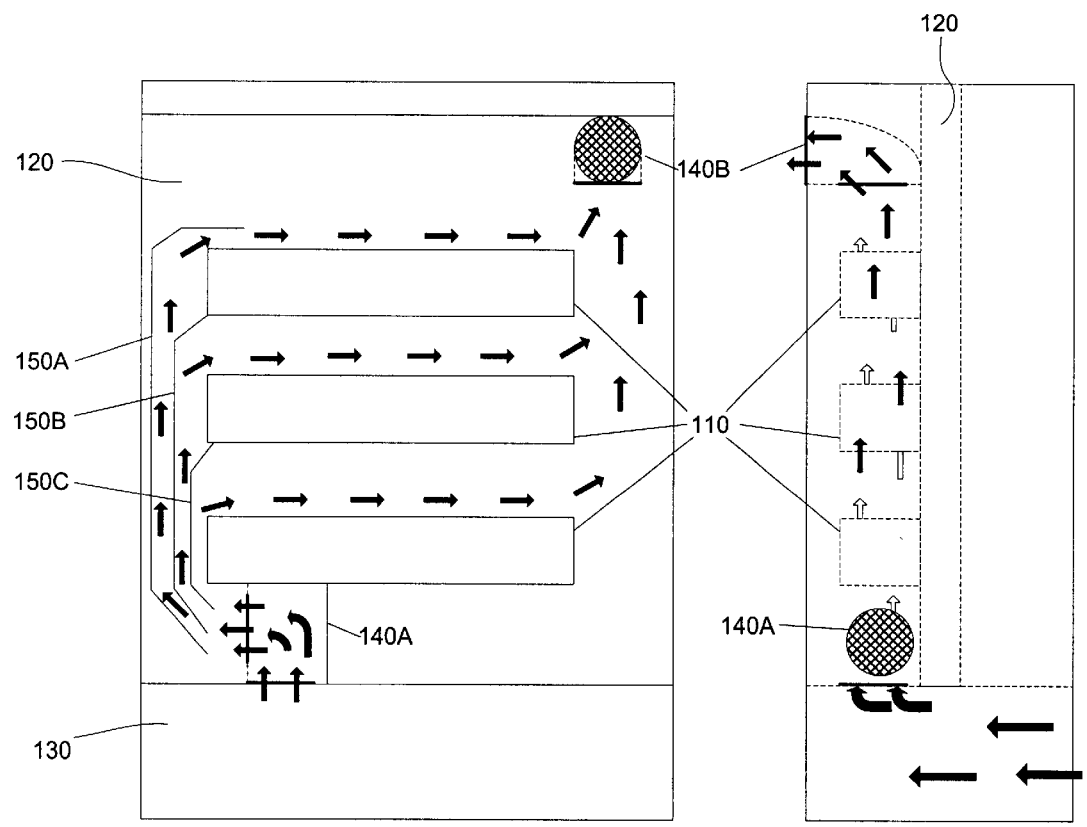

FIGS. 2A–2C shows top, back, and side views of system 100, respectively. Again, airflow is represented by arrows. While the structure shown in FIGS. 2A–2C is similar to (or the same as) the structure already shown in FIG. 1, these additional views may provide greater clarification for how air flows through system 100. For example, FIGS. 2A and 2C more clearly show airflow entering the front of system 100 at the bottom and airflow exiting system 100 from the back near the top. FIGS. 2B and 2C also show more clearly the flow of air through air guides 150A–150C and the formation of airflow branches.

FIGS. 3A–3C show exemplary exhaust modules 310, 320, 330, respectively, which may be used for exhaust modules 140A and 140B in system 100. One function of the exhaust module is to draw air in from an opening in one side and out an opening in another side. As shown in FIG. 3A, exhaust module 310 includes two openings (one in the bottom and one in the side) and motorized propeller 312 (e.g., fan) at the side opening to draw airflow from the bottom opening to the side opening. As shown in FIG. 3B, exhaust module 320 includes two openings (one in the bottom and one in the side) and motorized propeller 322 (e.g., fan) at the bottom opening to draw airflow from the bottom opening to the side opening.

FIG. 3C shows exhaust module 330, which includes two openings (one in the bottom and one in the side), backward curved motorized impeller 332 on another side, air guide 334, and pressure equalization chamber 336. Impeller 332 draws airflow from the bottom opening into the center of impeller 332 and forces air out radially. A portion of the radially forced air from impeller 332 goes directly out the side opening (e.g., air from the impeller part closest to the side opening), while the remaining air from impeller 332 is directed by air guide 334 around impeller 332 and out of the side opening. Air guide 334 is shown as connecting to the bottom of impeller 332 and curving in a spiral shape around impeller 332 to the top. Pressure equalization chamber 336 evens out the air from exhaust module 330. In one embodiment, pressure equalization chamber 336 comprises a chamber having at least one perforated wall through which air passes.

Other implementations for exhaust modules may be used to force air from an opening on one side into an opening on an orthogonal side.

EXEMPLARY METHODS

Figure 4:
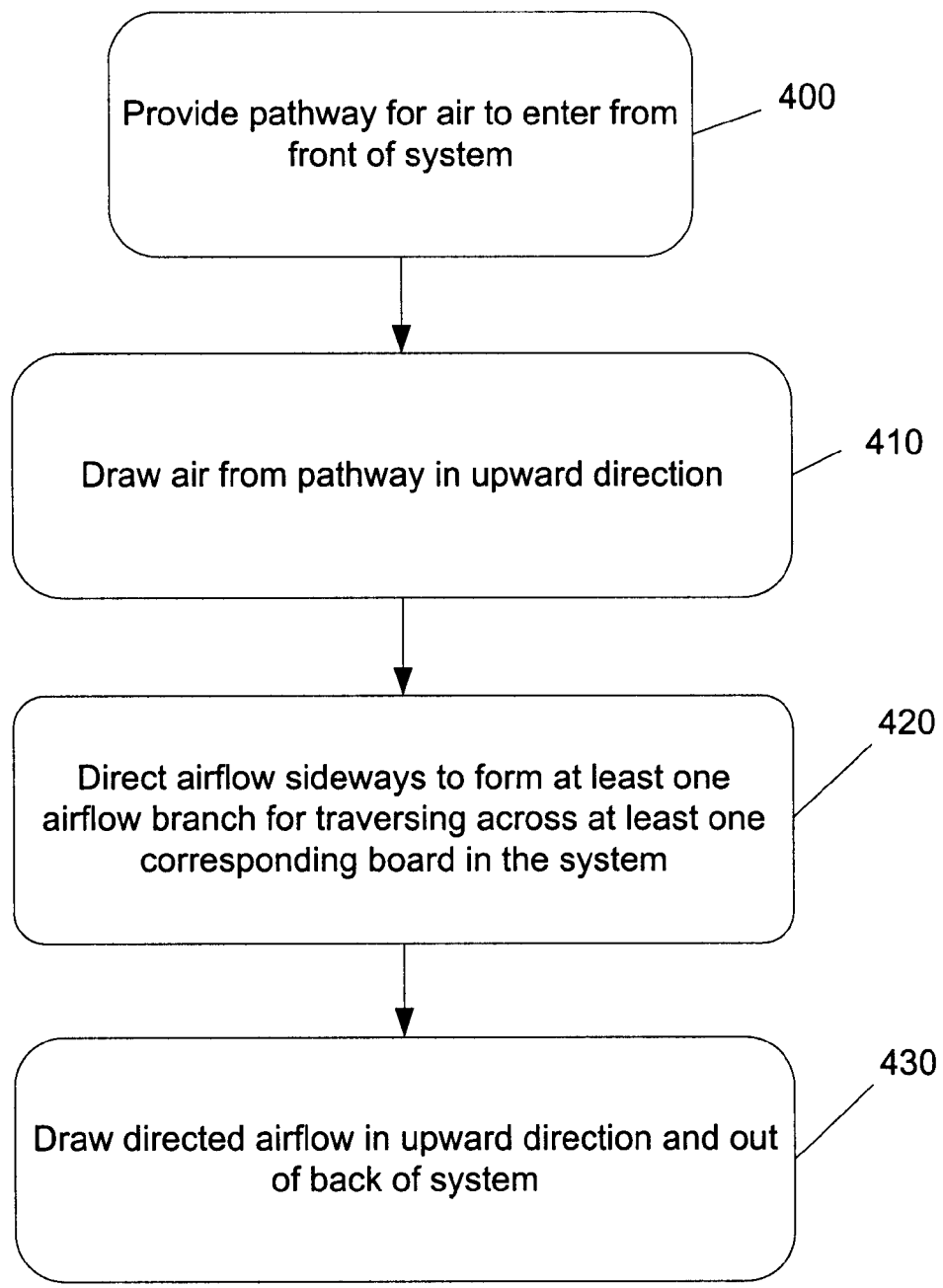
FIG. 4 is a flow diagram showing the method used to cool system components, according to one embodiment of the invention.

Exemplary methods consistent with the invention are now described. These methods may be described in connection with the exemplary apparatus described above or may be carried out by other apparatus. FIG. 4 is a flow diagram showing how the airflow traverses through a system to cool the system components.

A pathway containing an air inlet is provided for air to enter the front of the system (step 400). In other embodiments, the air inlet may be located at the back or side of the system. The air inlet may have a fan for drawing air into the system (not shown) or provide access to outside air without any active generation of airflow.

Air is drawn from the pathway in an upward direction (step 410). This may be performed by an exhaust module (such as shown in FIGS. 3A–3C) or other devices located above or in the pathway. As shown in FIGS. 1 and 2B, exhaust module 140A draws air from the pathway in an upward direction, then direct it to the side and into the air guides. Alternatively, an exhaust module (or other device) may be used for drawing air in an upward direction directly into air guides (rather than re-directing the airflow sideways).

The airflow is directed sideways to form at least one airflow branch for traversing across the surface of at least one circuit board (step 420). The airflow branch provides cooling to the components mounted on the circuit board(s) and preferably one branch is used for one circuit board. While three airflow branches are shown in FIGS. 1 and 2B, fewer or more airflow branches may be formed. The airflow branches may be formed using air guides (e.g., air guides 150). The air guides (or openings in the air guides) may need to be adjusted so that an appropriate amount of airflow (e.g., CFMs) is available to form respective airflow branches for cooling the components.

The airflow branches are drawn upward (preferably after they have traversed across the corresponding circuit board surfaces) and out of the back of the system (step 430). In alternative embodiments, the airflow branches are drawn upward and out of the front, top, or side of the system. This step may be performed using an exhaust module (such as one of the ones shown in FIGS. 3A–3C) or other devices located above or to the side of the circuit boards.

CONCLUSION

Systems and methods, consistent with the present invention, provide forced air to cool components contained in the system. According to the invention, airflow may enter and exit the system through the front and back (or vice-versa), rather than the sides of the system. In one embodiment, the airflow is re-directed in an upward direction, then split to form airflow branches traversing in a side-to-side direction. The airflow branches traverse across the surfaces of circuit boards, then are directed in an upward direction and out the back (or front) of the system. The airflow branches preferably move substantially the same volume of air per unit of time. Other aspects of the invention are described herein.

The foregoing description of preferred embodiments of the present invention provides illustration and description, but is not intended to be exhaustive or to limit the invention to the precise form disclosed. Modifications and variations are possible in light of the above teachings or may be acquired from practice of the invention.

The scope of the invention is defined by the claims and their equivalents.

What is claimed is:

1. An apparatus for cooling a system, comprising:
   an air inlet for drawing airflow in a first direction;
   a first module for drawing airflow from the air inlet to a second direction;
   a plurality of air guides for guiding airflow from the first module to a plurality of airflow branches in a third direction across surfaces of respective circuit boards on which electronic components are mounted;
   a vertical pathway for combining the plurality of airflow branches to form an airflow in the second direction; and
   a second module for redirecting airflow from the vertical pathway and expelling the airflow out of the system,
   wherein the first direction comprises at least one of a front-to-back direction and a back-to-front direction, the second direction comprises a bottom-to-top direction, and the third direction comprises a side-to-side direction.

2. The apparatus according to claim 1, wherein each of the plurality of air guides has a respective opening through which air may pass.

3. The apparatus according to claim 2, wherein, for each air guide, the respective opening is sized so that the volume of air moved per unit of time in each airflow branch is substantially the same.

4. The apparatus according to claim 2, wherein, for each air guide, the respective opening is sized so that the temperature of the components mounted on the corresponding circuit board is maintained within predetermined tolerances.

5. The apparatus according to claim 2, wherein a first air guide guiding an airflow branch above the airflow branch of a second air guide has a narrower opening than the second air guide.

6. A system, comprising:
   a front and a back;
   a plurality of circuit boards;
   a plurality of electronic components mounted on each circuit board;
   an air inlet, connected to the front, for drawing airflow, in at least one of a front-to-back direction and a back-to-front direction, into the system;
   a first fan for drawing airflow, in an upward direction, from the air inlet;
   a plurality of air guides for directing airflow, in an upward direction, from the first fan and redirecting the airflow, in a side-to-side direction, into a plurality of airflow branches across surfaces of respective circuit boards; and
   an exhaust module for drawing airflow, in an upward direction, from the plurality of airflow branches and directing air out of the system.

7. The system according to claim 6, wherein the plurality of boards are oriented horizontally and each of the plurality of boards corresponds to one of the plurality of air guides, and wherein each of the respective plurality of air guides extends vertically to a location above its corresponding board.

8. The system according to claim 6, wherein each of the plurality of air guides has an opening through which air passes.

9. The system according to claim 8, wherein, for each air guide, the respective opening is sized so that the volume of air moved per unit of time in each airflow branch is substantially the same.

10. The apparatus according to claim 8, wherein a first air guide guiding an airflow branch above the airflow branch of a second air guide has a narrower opening than the second air guide.

11. The system according to claim 8, wherein each air guide redirects an airflow branch across components mounted on a corresponding circuit board.

12. The system according to claim 11, wherein, for each air guide, the respective opening is sized so that the temperature of the components mounted on the corresponding circuit board is maintained within predetermined tolerances.

13. A method of cooling components mounted on a plurality of circuit boards contained in a system, comprising:

providing a pathway for air to enter the system in a first direction;

drawing, in a second direction, airflow from the pathway;

creating, from the airflow in the second direction, a plurality of airflow branches traversing in a third direction across a surface of a corresponding circuit board, each of the plurality of airflow branches being formed using one of a plurality of air guides;

forming a vertical airflow from the airflow branches after they have traversed the corresponding circuit boards;

expelling the vertical airflow out of the system, wherein the first direction comprises a front-to-back direction, the second direction comprises at least one of a top-to-bottom direction and a bottom-to-top direction, and the third direction comprises a side-to-side direction.

14. The method according to claim 13, wherein, in the step of creating a plurality of airflow branches, each airflow branch moves substantially the same volume of air per unit of time.

15. The method according to claim 13, wherein, in the step of creating a plurality of airflow branches, each airflow branch moves sufficient air such that the temperature of the components mounted on the corresponding circuit board is maintained within predetermined tolerances.

16. The method according to claim 13, wherein each of the plurality of air guides has an opening and the size of the opening is based on an amount of airflow for each of the plurality of circuit boards.

17. The method according to claim 16, wherein a first air guide forming an airflow branch above the airflow branch formed by a second air guide has a narrower opening than the second air guide.

18. The apparatus of claim 1, wherein each of the plurality of air guides corresponds to one of the respective circuit boards, the circuit boards being oriented horizontally, and wherein each of the respective plurality of air guides extends vertically to a location above its corresponding circuit board.

* * * * *